United States Patent
Maharshak et al.

(10) Patent No.: US 7,291,795 B2
(45) Date of Patent: Nov. 6, 2007

(54) FLEXIBLE PRINTED CIRCUITS WITH MANY TINY HOLES

(76) Inventors: Arie Maharshak, 135 Haof Ave., Shave-Zion 25227 (IL); Tomer Maharshak, 135 Haof Ave., Shave-Zion 25227 (IL); Nitsan Maharshak, 135 Haof Ave., Shave-Zion 25227 (IL)

( * ) Notice: Subject to any disclaimer, the term of this patent is extended or adjusted under 35 U.S.C. 154(b) by 402 days.

(21) Appl. No.: 10/814,575

(22) Filed: Apr. 1, 2004

(65) Prior Publication Data

US 2005/0217895 A1    Oct. 6, 2005

(51) Int. Cl.
*H05K 3/00* (2006.01)
*H05K 1/11* (2006.01)

(52) U.S. Cl. ............... 200/292; 29/829; 174/262; 200/512; 361/781

(58) Field of Classification Search ............ 29/825, 29/829, 846; 174/250–257, 260–268; 200/16 R–16 D, 200/11 DA, 512–517, 547–550, 292; 361/748, 361/749, 751, 777–781
See application file for complete search history.

(56) References Cited

U.S. PATENT DOCUMENTS

| | | |
|---|---|---|
| 3,934,335 A | 1/1976 | Nelson |
| 4,033,030 A * | 7/1977 | Robinson et al. .......... 29/622 |
| 4,518,646 A | 5/1985 | Nichols, Jr. |
| 4,770,922 A | 9/1988 | Hatakeyama et al. |
| 4,781,495 A | 11/1988 | Hatch et al. |
| 4,803,450 A * | 2/1989 | Burgess et al. ......... 333/238 |
| 4,882,000 A | 11/1989 | Ozaki |
| 4,894,271 A | 1/1990 | Hani et al. |
| 4,929,370 A | 5/1990 | Hatch et al. |
| 5,229,549 A * | 7/1993 | Yamakawa et al. ......... 174/262 |
| 5,294,290 A | 3/1994 | Reeb |
| 5,309,316 A | 5/1994 | Yagi et al. |
| 5,416,276 A | 5/1995 | Hou et al. |
| 5,513,078 A * | 4/1996 | Komrska et al. .......... 361/816 |
| 5,583,721 A | 12/1996 | Kim |
| 5,654,528 A | 8/1997 | Tanaka |
| 5,826,126 A | 10/1998 | Nomura et al. |
| 6,096,411 A * | 8/2000 | Nakatani et al. .......... 428/209 |
| 6,121,701 A | 9/2000 | Kloeppel et al. |
| 6,136,127 A | 10/2000 | De Bastiani |
| 6,180,215 B1 | 1/2001 | Sprietsma et al. |
| 6,198,060 B1 * | 3/2001 | Yamazaki et al. ......... 200/305 |
| 6,297,968 B1 | 10/2001 | Nakai |
| 6,323,436 B1 | 11/2001 | Hedrick et al. |
| 6,345,998 B1 | 2/2002 | Lee |
| 6,356,449 B1 | 3/2002 | Sasaki et al. |
| 6,433,284 B1 | 8/2002 | Lin et al. |
| 6,452,754 B1 | 9/2002 | Mizuta et al. |
| 6,528,914 B2 | 3/2003 | Kloeppel et al. |
| 6,780,493 B2 * | 8/2004 | Noda et al. ............... 428/209 |
| 6,831,236 B2 * | 12/2004 | Higuchi et al. ............ 174/264 |
| 6,936,777 B1 * | 8/2005 | Kawakubo ................. 200/1 B |
| 6,996,902 B2 * | 2/2006 | Suzuki et al. ................ 29/852 |
| 7,053,312 B2 * | 5/2006 | Hishinuma et al. ......... 174/254 |

* cited by examiner

*Primary Examiner*—Michael A. Friedhofer
(74) *Attorney, Agent, or Firm*—William J Sapone; Coleman Sudol Sapone P.C

(57) ABSTRACT

A switch or circuit board having a first conductive area on a first side of the board, a second conductive area on a second side of the board, several tiny holes running through the board from the first side to the second side, and a conductive material substantially filling the holes by capillary force, where the conductive material forms an electrical connection between the first conductive area and the second conductive area.

22 Claims, 6 Drawing Sheets

FLEXIBLE PRINTED CIRCUITS WITH MANY TINY HOLES

FIELD OF THE INVENTION

The present invention relates in general to methods of producing flexible printed circuits, and particularly to producing flexible printed circuits with many tiny holes.

BACKGROUND OF THE INVENTION

Electronic printed circuits board (PCB) and flexible printed circuits (FPC) are known. High component density is available through the use of fine line lithography and multi-layer PCB. Generally, the cost of manufacturing lithography based PCB's is substantial. However, there are applications in which high component density is not desired, but the cost of manufacturing the FPC is critical to the commercial success of the product. In some applications, the size of the FPC is determined by the shape of the product and not by the area needed to position the few electronic components. Examples for such products are toys, electronic books and other consumer products. Cheap flexible circuits may be used, among other uses, in alarm systems for card holders as is described in U.S. Pat. No. 5,373,283 and U.S. Pat. No. 4,652,865, and in electronic books disclosed in U.S. Pat. No. 6,041,215.

Various inventions concerning electronic books are cited in U.S. Pat. No. 6,041,215 disclosed by Maddrell et al. A reader may use an electronic book and is able to select an answer, for example out of a possible choice of four answers to a question in the text, by depressing a switch. The response of the user is relayed from the switch by electrically conductive leads to an electronic module, which operates a feedback unit, such as a loudspeaker, to emit a feedback signal to the user in response to a correct answer. Usually, the electronic module includes a processor, a feedback device, and a battery for power.

Most often, production of such a consumer electronic product demands intricate manufacturing techniques for inserting components in between the thickness of a sheet, the removal of special cutouts, the addition of spacers and unusual bookbinding methods. Therefore, the cost of these devices may be high due to the cost of the added electric and electronic components and to the increased costs of the manufacturing techniques employed.

To make these devices more available, it would be advantageous to reduce the cost by saving on the components and on the sophisticated printing and processing methods.

In the production of PCB and FPC it is often necessary to have an electrical connection bridging conductive lines on opposite sides of the printed circuit. The art of rigid printed circuit production has advanced to the point of making multi-layered board with highly dense and elaborate connection between layers. In simple form, as depicted in FIG. 1, a method is depicted in accordance with the prior art of creating via connection 10 between a first conductive line 12A and a second conductive line 12B on opposite sides of a rigid non-conductive board 14. The method may include drilling a via hole 10 in a location where the two conductive lines 12A and 12B overlap, and plating the drilled hole with a conductive material 16. This method may not suitable for some production of low cost FPC.

Another method in the prior art for creating via connection between conductive lines on opposite sides of thin flexible sheet is depicted in prior art FIG. 2. This method may include providing a thin flexible non-conductive sheet 20 with a first conductive line 22 and a second conductive line 24 printed on first and second surfaces, and inserting a rivet 26 made of conductive material to create an electrical connection between the line 22 and line 24 on opposite sides of the sheet 20. This method may suffer from several disadvantages: Reliability of the connection is low as the rivets may tear the thin sheet if too tight or create intermittent electrical connection if too loose; long term durability is low, specifically when the mechanical strength of the thin sheet is poor; and the rivet gives extra bulk to the circuit.

SUMMARY OF THE INVENTION

Embodiments of the invention include a board such as for example a circuit board or flexible circuit board with a first conductive area on for example a first side and a second conductive area on for example a second side of such board. The board may be fitted with for example a plurality of holes that may open or end on both such first side and such second side of such board. A conductive material in the form of for example a liquid or gel may be applied or for example painted onto one or both sides of such board so that such material may for example substantially fill some or all of such holes and may for example establish a connection through which an electric current may pass from for example the first conductive area to the second conductive area.

Embodiments of the invention may include a switch having for example a board with for example a plurality of holes running through such board from a first side to a second side. A conductive material may be applied to such board so that such material may for example substantially fill or substantially fill a plurality such as two or more of such holes and so that such material is capable of forming an electrical connection between a conductive area on a first side of such board and a conductive area on a second side of such board.

Embodiments of the invention may include a method of for example forcing a conductive liquid or gel into a plurality of holes in a board such as for example a circuit board so that the liquid forms an connection capable for example of carrying a current between for example a conductive area on a first side of such board and a conductive area of a second side of such board.

Embodiments of the invention may be used in for example a card holder such as those described in U.S. Pat. No. 5,373,283, issued on Dec. 13, 1994 entitled Alarm System for a Card Holder and owned by the owner hereof and incorporated into this application by reference in its entirety.

BRIEF DESCRIPTION OF THE DRAWINGS

The present invention may be understood and appreciated more fully from the following detailed description taken in conjunction with the appended drawings in which.

Figure 1:
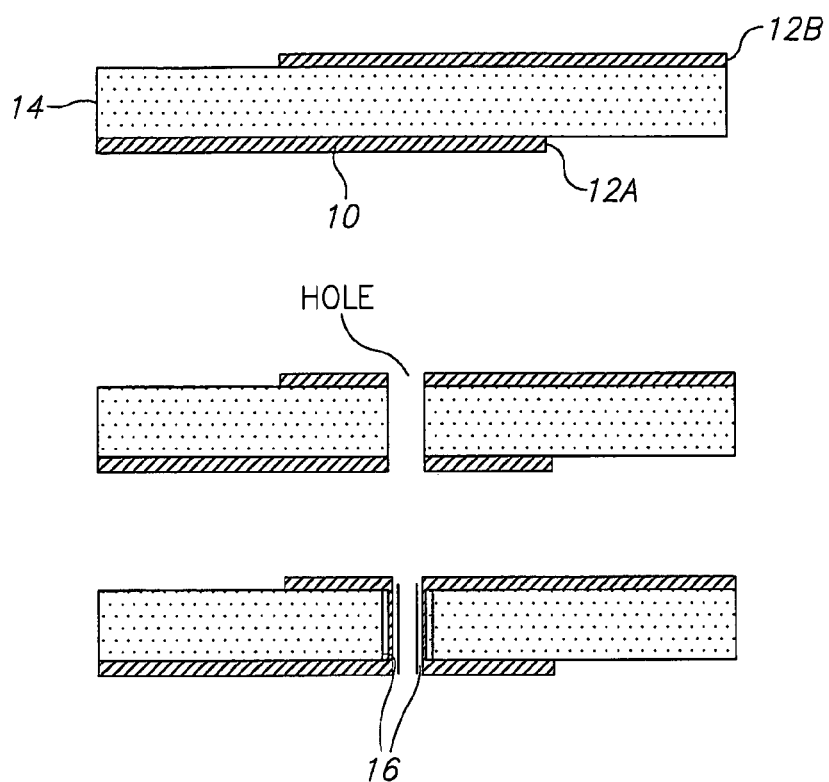
FIG. 1 depicts a method in accordance with the prior art of creating a via connection between a first conductive line and a second conductive line on opposite sides of a rigid non-conductive board.
Figure 2:
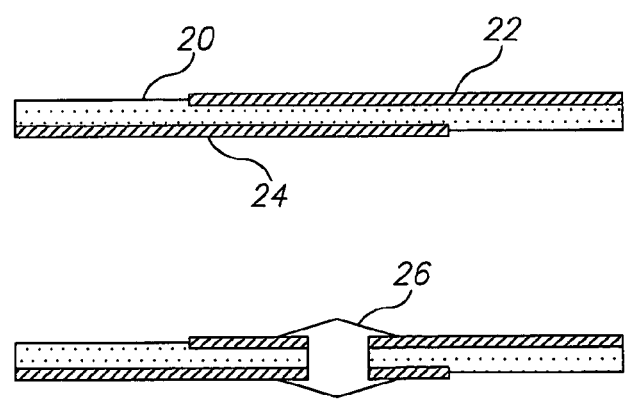
FIG. 2 depicts a method in accordance with the prior art of creating a via connection between conductive lines on opposite sides of a thin flexible sheet.

It will be appreciated that for simplicity and clarity, illustrations and elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 3:
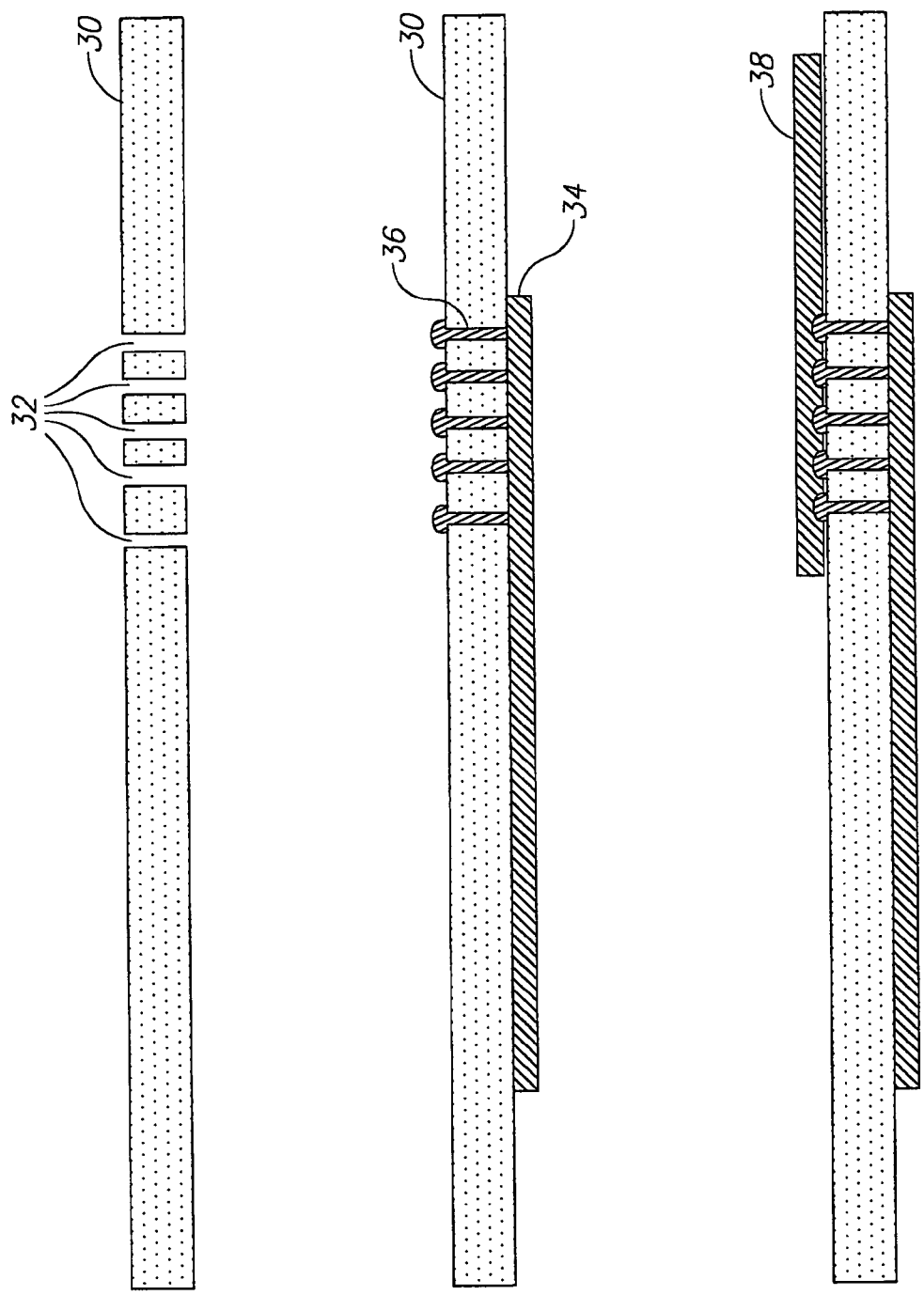
FIG. 3 depicts a method for producing via connections in FPC, in accordance with an embodiment of the invention.

Reference is made to FIG. 3 a method for producing via connections in FPC in accordance with an embodiment of the invention. In some embodiments, a thin, flexible, non-conductive substrate 30 such as for example paper, plastic, or other suitable material, may be fashioned with a set or array of tiny holes 32 in the location where a first conductive area such as for example a conductive line 34 and second conductive line 38 are to overlap on opposing sides of substrate 30 and make an electrical connection, or in the location where the substrate 30 is subject to mechanical stress and anchoring of the conductive line is needed.

Substrate 30 may in some embodiments be fashioned of for example paper, cardboard, plastic or other suitable materials that may be used as a substrate of a PCB.

The holes 32, which may be a plurality or up to several dozen or more holes 72, may be formed into the substrate by any method such as drilling, punching, laser ablation, aching, etc. Alternatively, the substrate material may include holes, such as porous material, cloth or non-woven cloth, etc. Preferably the holes 32 should extend all the way through the substrate 30 such that a first end of holes 32 may be an opening on one side of substrate 30, and a second end of hole 32 may be on a second side of substrate 30. In some embodiments, the diameter of the tiny holes 32 may be from less than 1 mm to approximately 2 mm. Other sizes are possible. In some embodiments tiny holes 32 may be of a diameter that permits paint or other conductive liquid to be efficiently pushed or pulled through the hole 32 so that the paint or conductive material substantially fills hole 32, and for such paint or liquid to retain an electrically conductive link or connection along the length of the hole. Preferably, the conductive material filling the plurality of holes 32 may be capable or carrying an electric current or forming an electrical connection between the conductive line 34 or area on the first side of substrate 30 and the conductive line 34 or area on the second side of substrate 30. In some embodiments, as few as two or three tiny holes 32 filled with conductive liquid may be sufficient to carry a small current from a conductive line 34 on one side of substrate 30 to a second conductive line on another side of substrate 30. More holes 32 may be used and filled with a conductive material to carry a larger current from a first conductive line 34 to a second conductive line 38. In some embodiments the number of holes 32 to be filled with a conductive material may be determined by a threshold current that is to be passed from one side of substrate 30 to another.

In some embodiments, the diameter of a hole may be substantially equal to the thickness of a substrate 30 through which hole 32 is bored. Other sizes are possible.

In some embodiments, a conductive material such as for example a conductive paint 36 or other liquid or flexible conductive material may be applied to or painted onto a first side of the substrate 30 to form the first conductive line 34. The paint 36 viscosity may be chosen so that the paint 36 may drawn into the tiny holes 32 by for example capillary force. Additionally or alternatively, the paint 36 may be forced into the holes 32 by pressing the wet paint for example by the wiping motion of a wiper such as those that may be used in silkscreen printing. Other methods of applying the conductive paint may be used such as for example ink-jet printing, press printing etc. In some embodiments, paint 36 may harden or solidify when it dries inside holes 32. In some embodiments, paint may be a graphite based polymer thick film ink such as those available from Acheson. Paints, gels or other substances may be used.

In some embodiments conductive paint may be applied to the second side of the substrate 30 to form the second conductive line 36. The conductive paint 36 applied to the second side of substrate 30 may come in contact with the paint 36 applied to the first side of substrate 30 and form electric contacts between the two sides.

Although in some embodiments, each contact made through a tiny hole 32 may lack the reliability, conductance and current carrying capacity of a traditional—large bore via-connection, the multiplicity of the tiny via-connections connected in parallel may in some embodiments have sufficient, equal or even superior performance. The number of holes 32 filled with conductive material and connecting conductive lines 34 on opposing sides of substrate 30 may be increased to accommodate an increase in the threshold current to be carried.

In some applications, such as for example those that involve anchoring a conductive line to the substrate 30, it may be unnecessary to apply conductive paint 36 to the second side.

Figure 4:
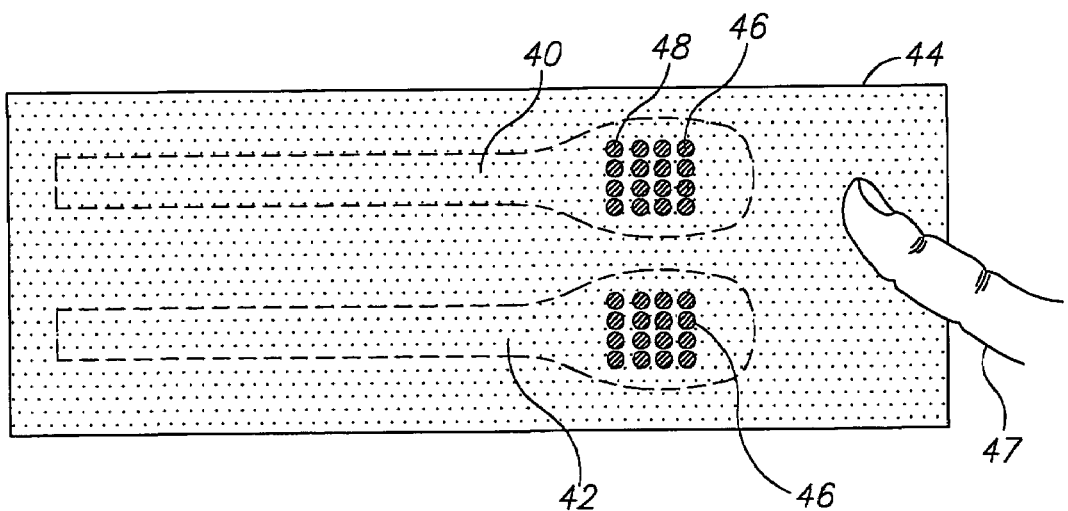
FIG. 4 depicts a substrate with many tiny holes used as a switch, in accordance with an embodiment of the invention.

Reference is made to FIG. 4, a depiction of many tiny holes used as a switch in accordance with an embodiment of the invention. In an exemplary embodiment of the invention, a touch switch may be fashioned by arranging a first conductive line 40 and a second conductive line 42 separated from each other by a non-conductive substrate 44. A conductive liquid such as for example paint 46 may be pushed from behind substrate 44 in the area of each of the first conductive line 40 or and second conductive line 42 and through the holes 48 in the substrate 44. Other ways of filling holes 48 are possible. By touching a conductive material (not shown) to the conductive paint 46 that was pushed through the tiny holes 48 to the second side of the substrate 40, an electrical connection may be formed between the first conductive line 40 and second conductive line 42.

In some embodiments, such a switch may be used in applications such as toys and interactive books in which the user touches the contacts with for example a bare finger 47 or with conductive element such as wand, thimble or a ring, or other conductive item that may be pressed into position in contact with the conductive paint 46 that was pushed through tiny holes 48 and then released from contact with conductive paint 46 that was pushed through tiny holes 48. The finger or ring may provide the electrical connection between the conductive paint 46 protruding from a side of substrate 44 above first conductive line 40 with the conductive paint 46 protruding from the same side of substrate 44 above second conductive line 42.

In some embodiments, the switch depicted in FIG. 4 may not require spacers or pads. Conductive lines 40 and 42 may be hidden on the back-side of substrate 44, protected from damage and accidental shorting and out of view. In some embodiments, only tiny spots of conductive paint 46 that were maneuvered through the holes 48 may remain visible on the front side of substrate 44. In some embodiments, the spots may be incorporated into the artwork of the game, book or other object where the switch may be included. The surface of substrate 44 that may face a user of an object that includes the switch may be smooth since the conductive lines 40 and 42 may be located on a hidden side of substrate 44. This smoothness may also facilitate easier application of artwork to the front side of substrate 44 and may enhance its aesthetic appearance.

In some embodiments, conductive paint 46 or other liquid or material may be applied on a user-facing side of the substrate 44 to increase the size of the switch and improve the artistic appearance, or the reliability of the switch.

In operation, when the user's finger is used to activate the switch, the resistance in the close state may not be very low. The monitoring electronics may be configured to sample repetitively the resistance across the switch and react when the resistance momentarily decreases substantially. Alternatively, the monitoring electronics may be configured to monitor the capacitance across the terminals and be activated when the capacitance increases.

In some embodiments, fashioning a switch by pushing for example a conductive paint 46 through tiny holes 48 may prevent or diminish a weak fold line that may be caused for example by repetitive bending along the same line. Multiple tiny holes 48 may spread the weakness that may be caused by repeated bending over a larger area, thereby possibly diminishing the negative effects of such bending. Furthermore, since tiny holes 48 may be filled with paint 46 or other conductive materials, holes 48 may not weaken the substrate 44 as may be the case with large unfilled holes as may be used in the prior art.

In some embodiments, a non-conductive overlay may be applied over conductive lines 40 or 42 to prevent pealing off of conductive line 40 or line 42 from substrate 44.

Figure 5:
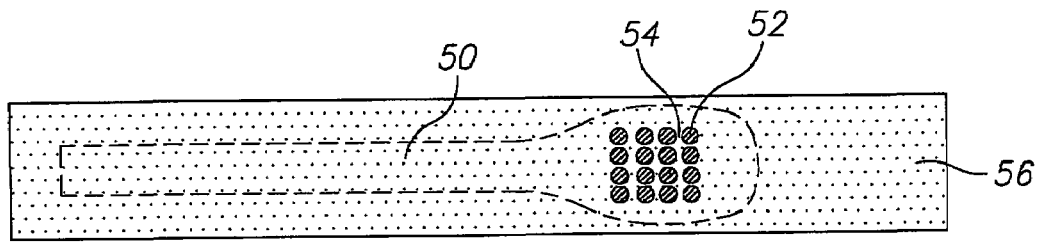
FIG. 5 depicts multiple tiny holes creating a bond between a conductive line and a substrate, in accordance with an embodiment of the invention.

Reference is made to FIG. 5, a depiction of multiple tiny holes creating a bond between a conductive line and a substrate, in accordance with an embodiment of the invention. Conductive paint 52—in the pattern of line 50—may be applied to a bottom of substrate 56, and pushed, pulled, penetrated by capillarity, or otherwise forced from the bottom or first side of substrate 56 through holes 54 to a top or second side of substrate 56. Such paint 52 or other material may in some embodiments anchor a section of conductive line 50 to substrate 56 as a result of penetrating the holes. In some embodiments, paint 52 or an adhesive or cement may be used to create a tight bond between the substrate 56 and a portion of the conducting line 50 to which such adhesive is applied.

Figure 6:
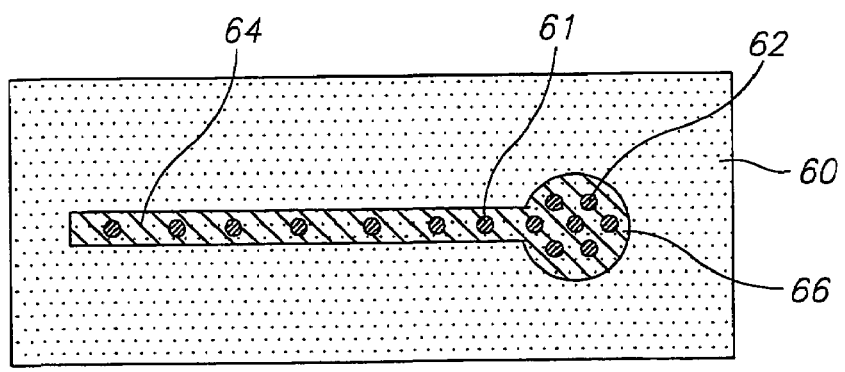
FIG. 6 depicts the use of paint pushed through tiny holes in a substrate to anchor conductive patterns to a non-conductive substrate, in accordance with an embodiment of the invention.

Reference is made to FIG. 6, which depicts the use of conductive paint through tiny holes in a substrate to anchor conductive patterns to a non-conductive substrate in accordance with an embodiment of the invention. Paint 61 or an adhesive or other liquid or semi-liquid material may be pushed or forced through tiny holes 62 from a bottom or back side of substrate 60 to contact and anchor a conductive line 64 or pad 66 to substrate 60. Optionally, applying paint 61 to the other side of substrate 60 may increase the strength of the anchoring. In some embodiments, the liquid may be pulled through tiny holes 62 by capillary force.

Figure 7:
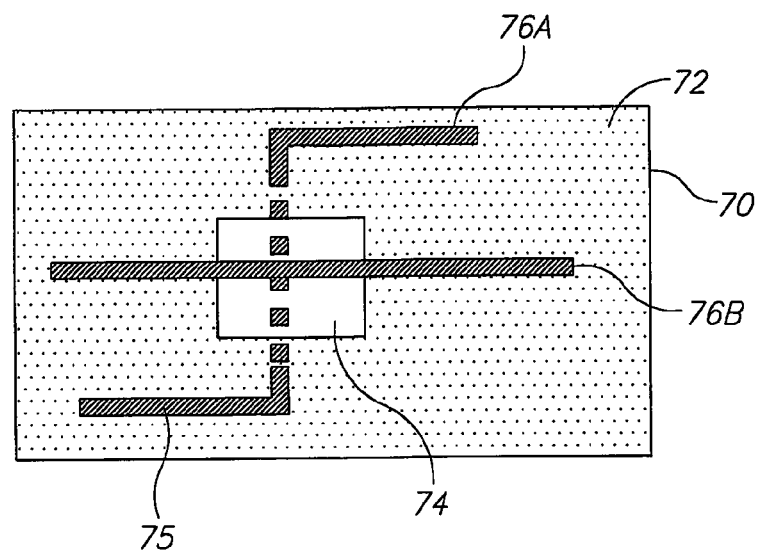
FIG. 7 depicts a substrate with a matrix of tiny holes, in accordance with an embodiment of the invention.

Reference is made to FIG. 7, a substrate with a matrix of tiny holes, in accordance with an embodiment of the invention. A non-conductive substrate 70 may be fashioned with an array of tiny holes 72. The array of holes 72 may in some embodiments cover an entire surface of the substrate 70, or some predefined section of the surface of substrate 70. The density of the array of tiny holes 72 may be such that the distance between holes 72 is smaller than the dimensions of the features of conductive areas that may be printed on the substrate 70, but larger than the diameter of the holes 72. In some embodiments, the density of holes 72 may be such that several holes 72 may be covered by each feature of a pattern printed on the substrate 70.

In some embodiments, the accurate registration of holes that would in the prior art have been be drilled in a substrate may not be necessary since the paint pushed through holes 72 may be accurately painted onto existing holes 72 in the substrate 70. In some embodiments, a substrate 70 with the same pattern or matrix of holes 72 may be used for different kinds of circuits, such that the application of conductive materials may be altered to match the circuit while the pattern or matrix of the holes 72 in the substrate 70 remains the same. A manufacturer may stock rolls of pre-perforated substrate 70 such as paper or plastic, print a circuit pattern to order, and cut the paper or plastic to the final size and shape before or after the printing process. Holes 72 may be made in substrate 70 before a conductive area is added to one or more sides of the substrate.

In an inventive method, the conductive paint used for a pattern such as a line, pad or through connector, printed over areas where tiny holes were drilled, may create an electrical connection from the printed side of the substrate 70 to the other side of substrate 70. In some embodiments, to prevent a short between conductors printed on opposite side of the substrate, tiny holes 72 in the overlapping area may be sealed or blocked with a non-conductive material 74. A first conductive line 76a may be applied to substrate 70 and pushed through tiny holes 72. The holes 72 that are sealed with non-conductive material 74 will not fill with conductive paint as they may be sealed with non-conductive material 74. On an opposite side or substrate 70, another conductive line 76b may be applied. Non-conductive material 74 may block first conductive line 76a from contacting second conductive line 76b. In some embodiments, first conductive line 76a and second conductive line 76b may be on the same side of a substrate 70. The intersection of the two lines may be separated by non-conductive material 74 that may be applied in a layer between first conductive line 76a and second conductive line 76b.

A further advantage of the use of tiny holes 72 with conductive paint forced through is that the array of tiny holes 72 may increase the adhesion of the printed patterns to the substrate 70.

In some embodiments, holes 72 may be formed in substrate 70 by drilling, punching, laser ablation, etching etc. Alternatively, the substrate 70 material may include holes, such as porous material, cloth or non-woven cloth, etc. Other materials may be used.

In an embodiment, a substrate 70 may have holes 72 arranged in patches or in other formations. Holes 72 may have dimensions larger than the dimensions used for the features in the PCB, and with hole 72 density such that the distance between holes 72 is smaller than the dimensions used for the features in the PCB, but larger than the diameter of the holes 72.

Patterns of holes 72 that overlap non-shorting lines may be positioned on sections of the substrate 70 without tiny holes 72, while through-substrate connections may be over sections with tiny holes 72.

If the PCB is of relatively low density, it may be possible to design the pattern of holes 72 with the limitations posed by the patches of tiny holes 72 on the substrate 70. For example, the pattern of tiny holes 72 may be patches of closely packed tiny holes 72 or patches containing no holes 72 or combination of both.

Figure 8:
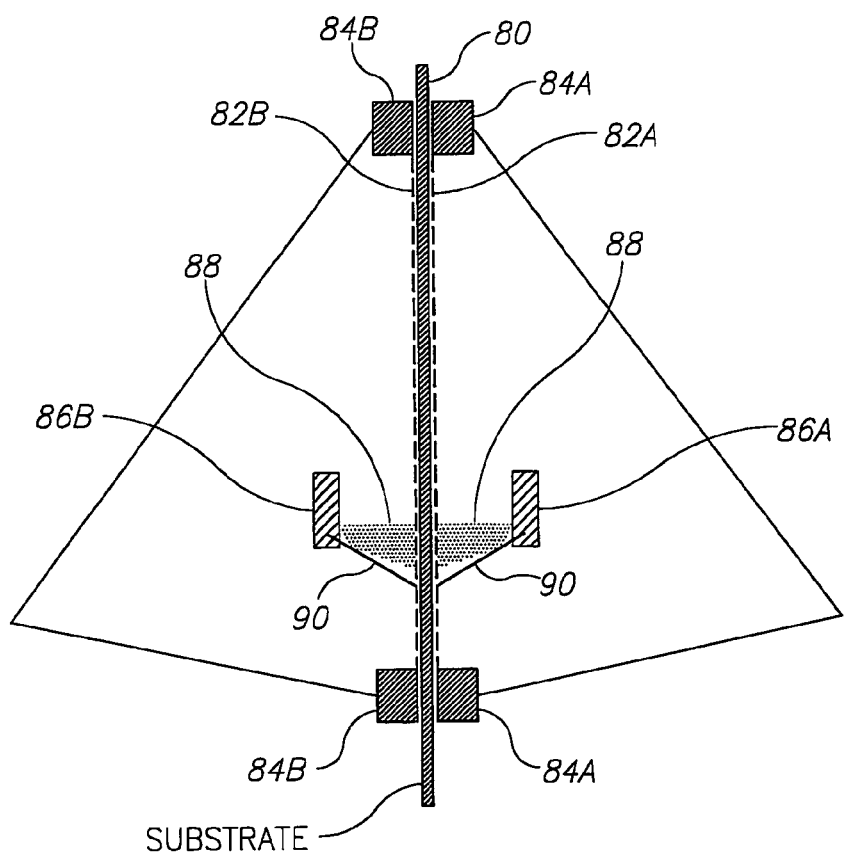
FIG. 8 depicts an application of conductive paint onto a substrate, in accordance with an embodiment of the invention.

Reference is made to FIG. 8, a depiction of an application of conductive paint onto a substrate in accordance with an embodiment of the invention. In some embodiments, it may be advantageous to print conductive patterns on both sides of a substrate at the same time or in time shorter than the time needed for the paint to dry. In some methods of silkscreen printing, a substrate 80 may be stretched on a rigid surface, and the silk screen with the design may be stretched on a frame and placed over the substrate 80. Paint may be applied to the silkscreen and may be spread over the substrate 80 using a wiper. A substrate 80 may be held between two silk screens 82A and 82B. Silk screens 82A and 82B may be stretched onto frames 84A and 84B respectively. Patterns may be drawn or otherwise fashioned into silk screens 82A and 82B indicating the areas that paint 88 is to be applied to substrate 80 as wipers 86A and 86B are passed over substrate 80. Wipers 86A and 86B may be used to spread the paint 88 from pools 90 or containers as the pools 90 and/or wipers 86A and 86B are passed over the two sides of substrate 80 between the frames 84A and 84B. Optionally the apparatus is positioned so that the wiper 86 motion is substantially vertical. In some embodiments, it may be advantageous to synchronize the motion of wiper 86A and 86B so that paint 88 is applied to the two sides of substrate 80 simultaneously and so that no net force will be applied to the silk screen 82A and 82B and substrate 80. Alternately or additionally, other methods of printing may be used to apply conductive and non-conductive paint to the substrate 80 such as ink injection, etc.

Figure 9A:
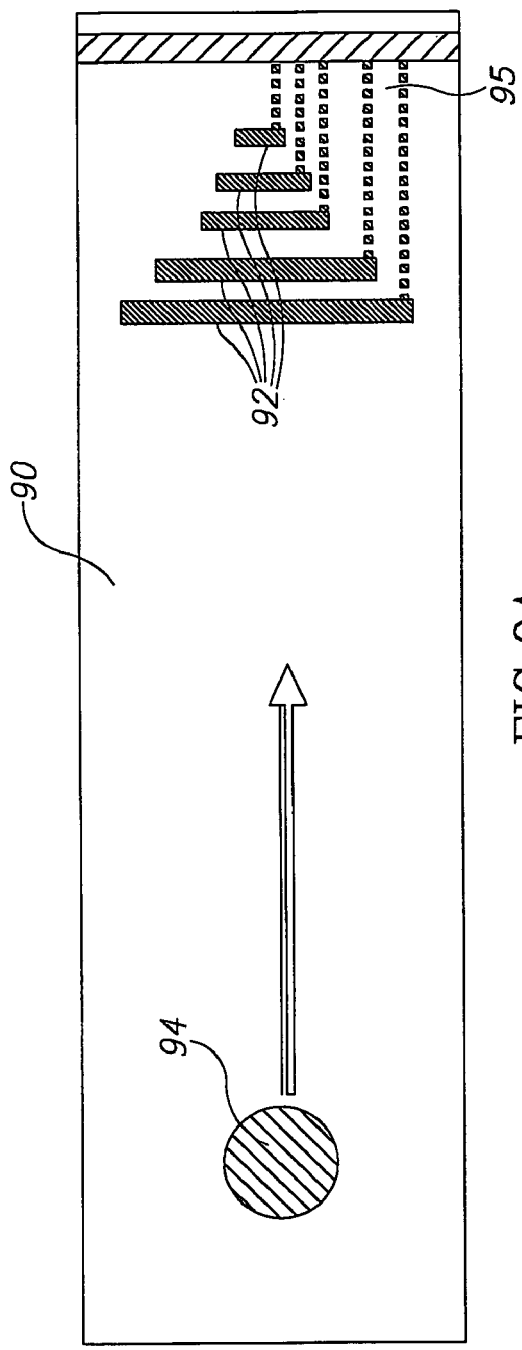
FIGS. 9A and 9b depict a bowling toy including an embodiment of the present invention.
Figure 9B:
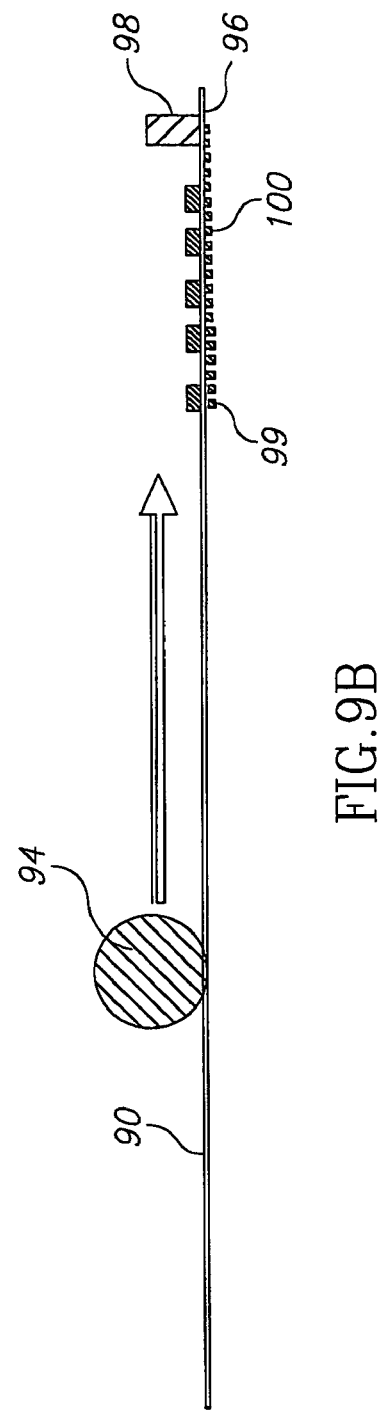

Reference is made to FIGS. 9A and 9B, depictions of a bowling toy including an embodiment of the present invention. FIG. 9A shows a top view, and FIG. 9B shows a side view of an exemplary application of the invention for a bowling game. In some embodiments the aim of the game is to roll the playing ball so it will pass over the smallest of the target contacts. Other game rules are possible. In an exemplary embodiment of the bowling toy, the toy surface 90 may be made of a thin flexible non-conductive material such as paper or plastic sheet. The conductive target lines 92 may be anchored via conductive paint onto the top side of the surface 90 in such proximity that the playing ball 94 which may have a conductive surface, causes a short between pairs of target lines as it roll over them. Referring to FIG. 9B, conductive lines 95 may be printed on the bottom side 96 of the toy surface 90. Lines 95 may be electrically connected to the target lines 92 through tiny via holes 99, and may, for example, be used for signaling the feedback electronics box 98. The feedback electronics box 98 may monitor the conductive lines 92 and determine the score or other aspects of the game. Visual and/or audio signals may be used to announce the ball's 94 progress along the target lines 92. Optionally, score records may be kept by the feedback electronics and used for determining the winner among several players, calculating accumulative score, average score, player improvement etc.

Optionally, the target lines may be pressure-sensitive switches that may be activated by the weight of the playing ball 94, in which case the playing ball need not have a conductive surface. Optionally, some or all the conductive lines 95 may be printed on the top side of the toy surface 90 instead of the bottom side of the toy surface 90.

In some embodiments, the toy surface 90 may be made of a flexible material so that it may be rolled up for storage. Depending on the room available, the game may be played with the toy surface only partially rolled open. The size of the toy surface 90, the location and size of the target lines 92 and feedback electronics box 98 may vary for convenience and artistic design of the toy. Artwork may be printed on the toy surface to give it pleasant appearance, to explain the use and rules of the game or for advertisement.

In some embodiments, tiny holes may be used to establish a connection in an area of an interactive book or touch screen. In such applications, tiny holes may be filled with a conductive material that may be pushed through a side of a substrate towards the side facing a user of for example an interactive book or touch screen. When the user touches the area with the tiny holes, a circuit may be completed and an electrical response such as a light or buzzer may be activated.

Figure 10:
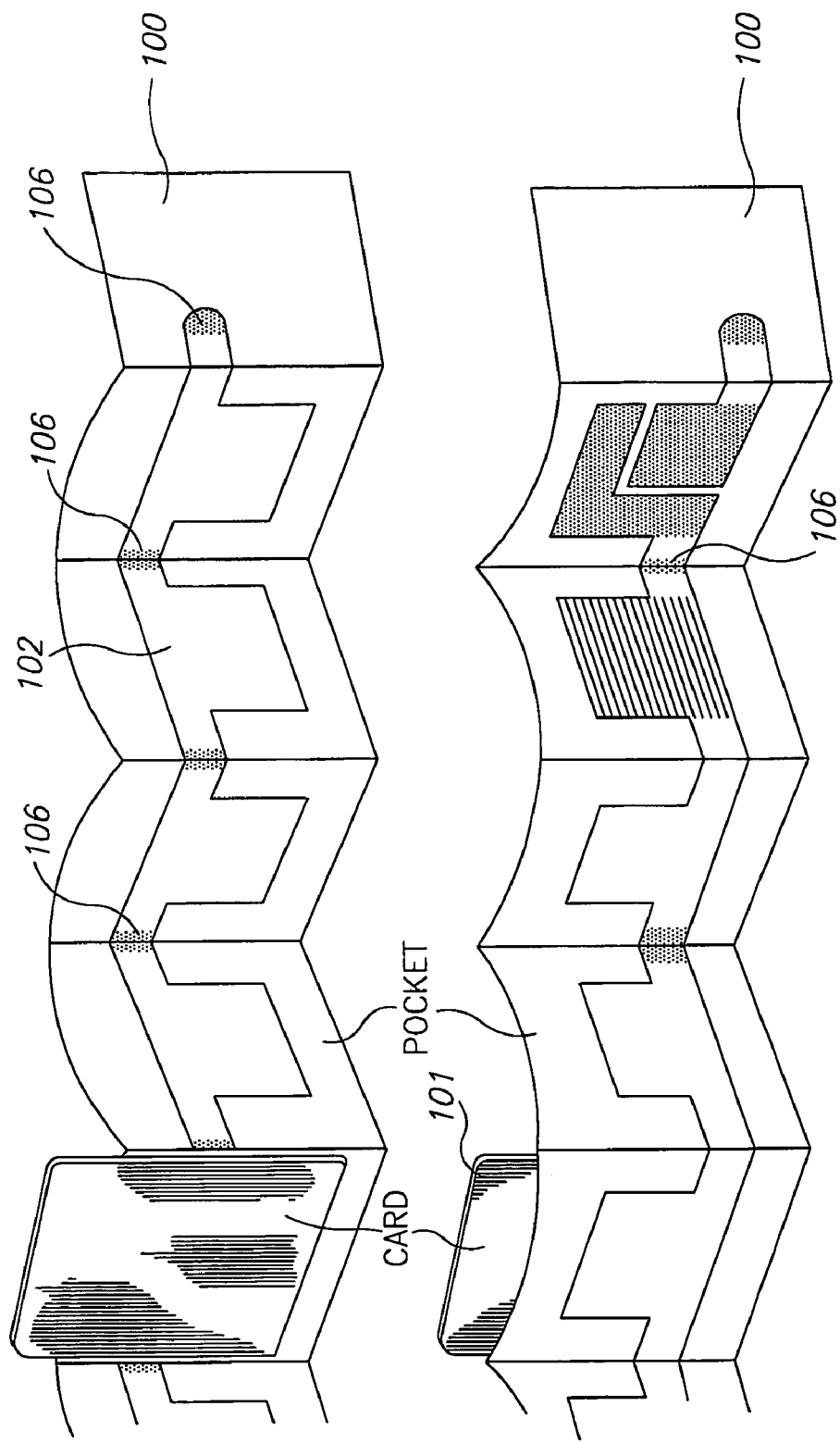
FIG. 10, depicts a card holder including an embodiment of the invention.

Reference is made to FIG. 10 a card holder in accordance with an embodiment of the invention. In some embodiments the invention may be used in connection with an embodiment of the invention described in U.S. Pat. No. 5,373,283 issued on Dec. 13, 1994 entitled Alarm System for a Card Holder, which is owned by the owner of this application and incorporated by reference herein. FIG. 10 depicts a view of strips from which a cardholder 100 may be constructed. The two strips may form a series of compartments that may fold into an accordion shape embodiment. The conductive paint 102 painted on the inner side of a certain compartment may touch—in case a card is not inserted into this specific compartment—the conductive paint on the opposite inner side of the compartment. Thus, folding the cardholder may cause a contact between the conductive paint 102 painted on the outer side of a first compartment and the conductive paint 102 painted on the outer side of a second compartment. This contact may for example short a circuit between the upper port and the lower port of the electronic module. This short may activate for example a buzzer that may emit for example an alarm signal to draw the attention of the card's owner (about the fact that a specific card was not inserted back to its compartment). In some embodiments, tiny holes 106 filled with conductive paint may anchor the conductive line to the substrate.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A circuit board comprising:
   a first conductive area on a first side of said board;
   a second conductive area on a second side of said board;
   said board comprising a plurality of holes, said holes with a first end on said first side of said board and a second end on said second side of said board; and
   a conductive material substantially filling said plurality of said holes by capillary force, said conductive material to form an electrical connection between said first conductive area and said second conductive area, said conductive material including an adhesive capable of holding a portion of said first conductive area onto said first side of said board.

2. The circuit board as in claim 1, wherein a diameter of said holes is approximately equal to a thickness of said board.

3. The circuit board as in claim 1, wherein said conductive material is applied to said board in a liquid form.

4. The circuit board as in claim 1, wherein said plurality of holes are formed in said board before said first conductive area is applied to said board.

5. The circuit board as in claim 1, wherein said first conductive area is a conductive line.

6. The circuit board as in claim 1, wherein said board is comprised of a flexible non-conductive substrate.

7. The circuit board as in claim 6, wherein said substrate is a porous material.

8. The circuit board as in claim 1, wherein said first conductive area and said second conductive area overlap.

9. The circuit board as in claim 1, wherein said material is filled into said holes by painting said material onto said second side of said board.

10. The circuit board as in claim 1, wherein the number of holes filled with said material and capable of establishing an electrical connection between said first conductive area and said second conductive area is at least two.

11. The circuit board as in claim 1, wherein the total electrical current passing through the conductive material substantially filling said plurality of said holes is above a threshold current.

12. The circuit board as in claim 1, wherein said holes are less than 2 millimeters in diameter.

13. The switch as in claim 12, wherein said board is comprised of a flexible non-conductive substrate.

14. A switch comprising:
    a board, said board comprising:
    a plurality of holes said holes with a first end on said first side of said board and a second end on said second side of said board; and
    a conductive area on a first side a said board;
    a conductive material substantially filling by capillary force at least one hole of said plurality of holes, said conductive material to form an electrical connection between said first conductive area and a conductive element applied to said material on said second side of said board, said conductive material including an adhesive capable of holding a portion of said first conductive area onto said first side of said board.

15. The switch as in claim 12, wherein a diameter of said holes is approximately equal to a thickness of said board.

16. The switch as in claim 14, wherein said conductive element may be pressed into contact with said conductive material and released from said contact with said conductive material.

17. A method comprising forcing, by capillary force, a conductive liquid into a plurality of holes in a non-conductive substrate, said liquid to form an electric connection between a first conductive area on a first side of said substrate and a second conductive area on a second side of said substrate, said conductive liquid including an adhesive capable of holding a portion of said first conductive area onto said first side of said substrate.

18. The method as in claim 17, wherein said liquid is to solidify in said holes when dry.

19. The method as in claim 17, wherein said forcing comprises painting said liquid onto said substrate.

20. The method as in claim 17, comprising painting said liquid onto said first side of said nonconductive substrate and onto a second side of said non-conductive substrate.

21. The method as in claim 17, comprising simultaneously painting said liquid onto said first side of said non-conductive substrate and onto second side of said non-conductive substrate.

22. A method comprising forcing a conductive liquid into a plurality of holes in a non-conductive substrate, said liquid to form an electric connection between a first conductive area on a first side of said substrate and a second conductive area on a second side of said substrate, and anchoring a portion of said first conductive area on a first side of said substrate with said conducting liquid.

* * * * *